US006536018B1

(12) United States Patent
Chisholm et al.

(10) Patent No.: US 6,536,018 B1
(45) Date of Patent: Mar. 18, 2003

(54) REVERSE ENGINEERING OF INTEGRATED CIRCUITS

(75) Inventors: Gregory H. Chisholm, Shorewood, IL (US); Steven T. Eckmann, Colorado Springs, CO (US); Christopher M. Lain, Pittsburgh, PA (US); Robert L. Veroff, Albuquerque, NM (US)

(73) Assignee: The University of Chicago, Chicago, IL (US)

( * ) Notice: Subject to any disclaimer, the term of this patent is extended or adjusted under 35 U.S.C. 154(b) by 268 days.

(21) Appl. No.: 09/587,519

(22) Filed: Jun. 5, 2000

(51) Int. Cl.[7] ................................................ G06F 17/50
(52) U.S. Cl. ...................... 716/4; 716/3; 716/5; 716/18
(58) Field of Search ................ 716/1–21; 717/141–144, 717/154–157

(56) References Cited

PUBLICATIONS

O'Hare et al, "Automated Abstract of Source Code for Structure Analysis," IBM Technical Disclosure Bulletin, vol. 37, No. 12, Dec. 1994, pp. 167–169.*

Gannod et al, "A Specification Matching Based Approach to Reverse Engineering," May 1999, pp. 389–398.*

Blair et al, "Content Addressability: An Exercise in the Semantic Matching of Hardware and Software Design," IEEE, Jan. 1989, pp. 41–47.*

Griswold et al, "Fast, Flexible Syntactic Pattern Matching and Processing," IEEE, 1996, pp. 144–153.*

Kazman et al, "Classifying Architecture Elements as a Foundation for Mechanism Matching," IEEE, Aug. 1997, pp. 14–17.*

* cited by examiner

*Primary Examiner*—Vuthe Siek
(74) *Attorney, Agent, or Firm*—Michael D. Rechtin; Foley & Lardner

(57) ABSTRACT

Software and a method therein to analyze circuits. The software comprises several tools, each of which perform particular functions in the Reverse Engineering process. The analyst, through a standard interface, directs each tool to the portion of the task to which it is most well suited, rendering previously intractable problems solvable. The tools are generally used iteratively to produce a successively more abstract picture of a circuit, about which incomplete a priori knowledge exists.

18 Claims, 12 Drawing Sheets

```
LABEL DEVICE VERTICES WITH THEIR DEVICE TYPE (BOTH GRAPHS);
LABEL NET VERTICES WITH THE NUMBER OF CONNECTIONS (BOTH GRAPHS);
MARK THE EXTERNAL CONNECTIONS AS BORDER (LIBRARY MODULE);
LOOP
{
   RELABEL ALL NON-BORDER NET VERTICES (BOTH GRAPHS);
   MARK AND REMOVE NET VERTICES WHOSE NEIGHBORS ARE MARKED
    BORDER (LIBRARY MODULE);
   IF (THERE IS A LABEL IN THE LIBRARY MODULE NOT FOUND IN THE
    SUBJECT NETLIST)
   {
     RETURN FAILURE;
   }
   REMOVE NODES FROM THE SUBJECT NETLIST WITH LABELS THAT ARE
    NOT IN THE LIBRARY MODULE;
   IF (ALL NET VERTICES ARE MARKED BORDER)
   {
     EXIT LOOP;
   }
   RELABEL ALL NON-BORDER DEVICE VERTICES (BOTH GRAPHS);
   MARK AND REMOVE DEVICE VERTICES WHOSE NEIGHBORS ARE
    MARKED BORDER (LIBRARY MODULE);
   IF (THERE IS A LABEL IN THE LIBRARY MODULE NOT FOUND IN THE
    SUBJECT NETLIST)
   {
     RETURN FAILURE;
   }
   REMOVE NODES FROM THE SUBJECT NETLIST WITH LABELS THAT ARE
    NOT IN THE LIBRARY MODULE;
   IF (ALL DEVICE VERTICES ARE MARKED BORDER)
   {
     EXIT LOOP;
   }
}
THE SMALLEST LABEL SET IN THE SUBJECT NETLIST WILL BE THE CANDIDATE
 SET;
CHOOSE A VERTEX FROM THE LIBRARY MODULE WITH THE CORRESPONDING
 LABEL TO BE THE KEY NODE;


PHASE 1-PARTITIONING
   GENERATE CANDIDATE SUBCIRCUITS BY PARTITIONING THE SUBJECT
    NETLIST;

PHASE 2-MATCHING
   WHILE (THERE ARE UNTESTED CANDIDATES FROM THE SUBJECT NETLIST)
   {
     SELECT AN UNTESTED CANDIDATE;
     IF (CANDIDATE MATCHES A LIBRARY MODULE)
     {
       RECORD THE MATCH, AND REPLACE THE SUBCIRCUIT WITH ITS
       MODULE REPRESENTATION;
     }
   }
```

```
FOR EACH (NODE IN THE CANDIDATE SET)
{
   RELABEL DEVICE VERTICES WITH THEIR DEVICE TYPE (BOTH GRAPHS);
   RELABEL NET VERTICES WITH THE NUMBER OF CONNECTIONS (BOTH GRAPHS);
   MARK THE NODE FROM THE CANDIDATE SET AND THE KEY NODE AS MATCHED AND SAFE;
   WHILE (ALL VERTICES IN THE LIBRARY MODULE ARE NOT MATCHED)
   {
      RELABEL ANY UN-SAFE NODES WITH THEIR SAFE NEIGHBORS (BOTH GRAPHS);
      REMOVE NODES FROM THE SUBJECT NETLISTS WHOSE LABELS ARE NOT IN THE LIBRARY MODULE;
      IF (THE LIBRARY MODULE HAS A SET OF NODES WITH THE SAME LABEL THAT IS LARGER THAN THE
        CORRESPONDING LABEL SET IN THE SUBJECT NETLIST)
      {
         EXIT LOOP WITH FAILURE;
      }
      IF (A SINGLE VERTEX IN THE LIBRARY MODULE AND A SINGLE VERTEX IN THE SUBJECT NETLIST HAVE THE
           SAME LABEL AND THERE ARE NO OTHER VERTICES WITH THAT SAME LABEL)
      {
         MARK THEM SAFE AND MATCHED;
      }
      IF (THE SIZE OF A SET OF VERTICES OF THE SAME LABEL IN THE LIBRARY MODULE IS EQUAL TO THE SIZE OF
        THE SET IN THE SUBJECT NETLIST WITH A SIMILAR LABEL)
      {
         MARK THOSE SETS AS SAFE;
      }
      IF (NO MATCHES HAVE BEEN MADE AND NO VERTICES HAVE BEEN RELABELED)
      {
         CHOOSE AN UNMATCHED VERTEX FROM THE LIBRARY MODULE AND FIND THE SIMILARLY LABELED SET IN
           THE SUBJECT NETLIST;
         RETURN (CALL THIS MATCHING PROCEDURE USING THE LIBRARY MODULE VERTEX AS THE KEY AND THE
           SUBJECT NETLIST SET AS THE CANDIDATE SET);
      }
   }
   IF (ALL VERTICES IN THE LIBRARY MODULE ARE MATCHED)
   {
      VERIFY ISOMORPHISM AND REPLACE WITH A LIBRARY MODULE INSTANCE;
   }
}
```

FIG. 5

```
FOR EACH (SUBCIRCUIT C OF NETLIST S WITH m INPUTS AND n OUTPUTS)
{
  FOR EACH (PERMUTATION p OF INPUTS OF C)
  {
    IF (CANONICAL FORMS FOR OUTPUTS OF C UNDER PERMUTATION p
      MATCH CANONICAL FORMS FOR OUTPUTS OF M)
    {
      RECORD MATCH AND REPORTS SUCCESS;
    }
  }
}
```

REVERSE ENGINEERING OF INTEGRATED CIRCUITS

This invention was made with Government support under Contract No. W-31-109-ENG-38 awarded by the U.S. Department of Energy. The Government has certain rights in this invention.

FIELD OF THE INVENTION

The present invention relates to methods to improve the speed, accuracy and efficiency of Reverse Engineering of electronic circuits. The present invention is further drawn to computer systems and software to improve the speed, accuracy and efficiency of integrated circuits.

BACKGROUND OF THE INVENTION

Integrated circuits (ICs) are a relatively new technology generally comprising a small piece of semiconducting material, upon which transistors, connectors, and other functional units have been imprinted. Originally ICs were large, ungainly, and relatively simple devices, but have since evolved to a level of enormous complexity. Modern ICs can contain many millions of transistors in a single square centimeter. In general, ICs are designed from complex libraries of subcircuits that are carefully mapped, tested and documented for their intended use.

There are times, however, when an IC must be understood without the aid of the manufacturer's documentation. The process of understanding a circuit without specifications is called "Reverse Engineering." Situations requiring Reverse Engineering can arise under a number of circumstances. IC manufacturers, for example, often go out of business, or stop production of certain ICs, thereby presenting difficulties to dependent customers. Such a customer may need to understand the gate-level functionality of the IC in order to re-manufacture it. In addition, Reverse Engineering of ICs is useful for intellectual property analysis, competitive analysis, malfunction analysis, security analysis, or the verification of a manufacturer's specifications during the design process.

Reverse Engineering is the inverse of the design process. The design process begins with an abstract description of a target device and, through a succession of refinements, produces an implementable design. Reverse Engineering begins with the disassembly of a manufactured device and ends with an abstract description of its functionality. In the case of ICs, the disassembly process consists of obtaining an image of the IC's internal structure and extracting a transistor-level netlist from the image. This netlist description then undergoes transformation to successively higher levels of abstraction until it becomes a suitably high-level description of the circuit's behavior.

The Reverse Engineering of a modern IC presents a number of substantial difficulties. IC manufacturers generally endeavor to make ICs as small as possible, but with as much functionality as possible. In addition, manufacturers will often attempt to obfuscate the most important features of the circuit, with the intent to hinder Reverse Engineering. To the reverse engineer, who may begin with only a general understanding of the IC's function and an unmarked image of the IC itself, the task of unraveling a modern IC can seem impossible.

The art of Reverse Engineering of ICs has not advanced particularly far. It is standard practice to attempt Reverse Engineering of an IC without the aid of software suited to that task. In such a "manual" process, an image of the IC of interest will be magnified, allowing engineers to meticulously examine possible subcircuits. Often entire rooms are devoted to IC graphs used in the process of Reverse Engineering. This process is slow and obviously limited to ICs of a less complicated nature. Advancements in the art have languished, partly because of a failure to recognize possibilities for automation, and partly because of the seemingly insurmountable computational barriers to automation.

Notably, syntactic matching, although suggested as early as 1985, has never been demonstrated to successfully reverse engineer circuits of non-trivial complexity. Syntactic matching relies on a library of known subcircuits, and attempts to find exact matches for these subcircuits within a larger circuit. To accomplish this, the syntactic matching program must attempt to match every known library instance gate by gate with the unknown IC. For ICs of even trivial complexity, this process very quickly becomes computationally intractable. In addition, syntactic matching is very literal, and does not easily compensate for slight changes in a subcircuit that have no effect on function. For these reasons, syntactic matching has remained a laboratory practice.

Another possible approach involves semantic matching. Semantic matching seeks to reduce a subcircuit to a canonical form, which is dependent only on the input to output mapping of the circuit. The canonical form is then matched against a library of known canonical forms. Semantic matching is less literal than syntactic matching and more able to handle non-functional variations in a subcircuit. Semantic matching, however, is even more computationally intensive than syntactic matching. A straight semantic matching approach would involve examination of every possible subcircuit in an IC for relevance. For example, consider an IC with gates labeled 1 through N. The semantic matcher must start with gate 1, and assume that it itself forms a subcircuit. The semantic matcher must then look at gate 1 and gate 2 to see if they form a subcircuit together. Next gate 1 and gate 3, and so on until gate 1 and gate N are considered. The next iteration would examine gate 1, gate 2 and gate 3, and so forth. The effort required for this process is at least exponentially related to the number of gates in the IC. Semantic matching has thus not been successfully demonstrated prior to the present invention.

It is therefore an object of the invention to provide an improved automated aid for the Reverse Engineering of circuits or other components.

It is a further object of the present invention to provide an improved automated aid for the Reverse Engineering of ICs.

It is a further object of the present invention to provide an improved method for the use of syntactic matching for the Reverse Engineering of complex ICs.

It is a further object of the present invention to provide an improved method for the use of semantic matching for the Reverse Engineering of complex ICs.

It is a further object of the present invention to provide an improved method for the use of syntactic and semantic matching in cooperation for the Reverse Engineering of complex ICs.

It is a further object of the present invention to provide an improved automated aid for the use of syntactic and semantic matching in the Reverse Engineering of complex ICs.

It is a further object of the present invention to provide improved support methods for the use of syntactic and semantic matching in the Reverse Engineering of ICs.

It is a further object of the present invention to provide improved computational software to allow an operator to automate as much of the IC Reverse Engineering process as possible.

It is a further object of the present invention to provide improved software with convenient workflow.

It is a further object of the present invention to provide an improved, single software package that allows an operator to conveniently apply syntactic and semantic matching along with support methodologies to certain subsections of an IC at certain times in the Reverse Engineering process, with the goal of expediting the Reverse Engineering process.

It is a further object of the invention to improve the ability to reverse engineer complex ICs.

It is a further object of the present invention to provide a computer system operating with at least one processor and memory that can aid in the process of reverse engineering of ICs.

Further objects and advantages of the present invention, together with the organization and manner of operation thereof, will become apparent from the following detailed description of the invention when taken into conjunction with the accompanying drawings.

SUMMARY OF THE INVENTION

The invention relates to a computer system involving software and a method with multiple steps to analyze a circuit having a plurality of electronic or optical elements to determine the sequence of functions within the circuit. The invention is directed specifically toward the Reverse Engineering of ICs, but can be used to understand programmable logic arrays, optical switching systems and the like. The invention will be useful in Reverse Engineering, as well as other types of analysis applicable to the design, testing, manufacture, remanufacture and analysis of circuits.

One form of the present invention relates to the computer implementation of software to aid the Reverse Engineering process. The software allows the input of an integrated circuit graph or netlist. The netlist can be prepared for analysis by means of several graphing tools. These tools help the operator search for important pieces of the IC graph on which to focus analysis. The netlist can be then analyzed through means of accompanying matching tools. A library of known components is constructed, and for complicated circuits the IC will be analyzed iteratively, focusing on different subsections in order to simplify the Reverse Engineering process.

Another form of the present invention relates to a method for analyzing circuits and other similar items. An analyst applies one of several computational engines iteratively, arriving successively at a more complete picture of the overall functionality of a circuit.

The above described objects and embodiments are set forth in the following description and illustrated in the drawings described herein.

BRIEF DESCRIPTION OF THE DRAWINGS

FIG. 2 is a word representation of a syntactic matching methodology used to identify candidate subcircuits;

FIG. 3 is a word representation of a syntactic matching methodology used to match candidate subcircuits to library modules;

FIG. 5 is a word representation of a semantic matching methodology;

DETAILED DESCRIPTION OF THE MOST PREFERRED EMBODIMENT

Figure 1:
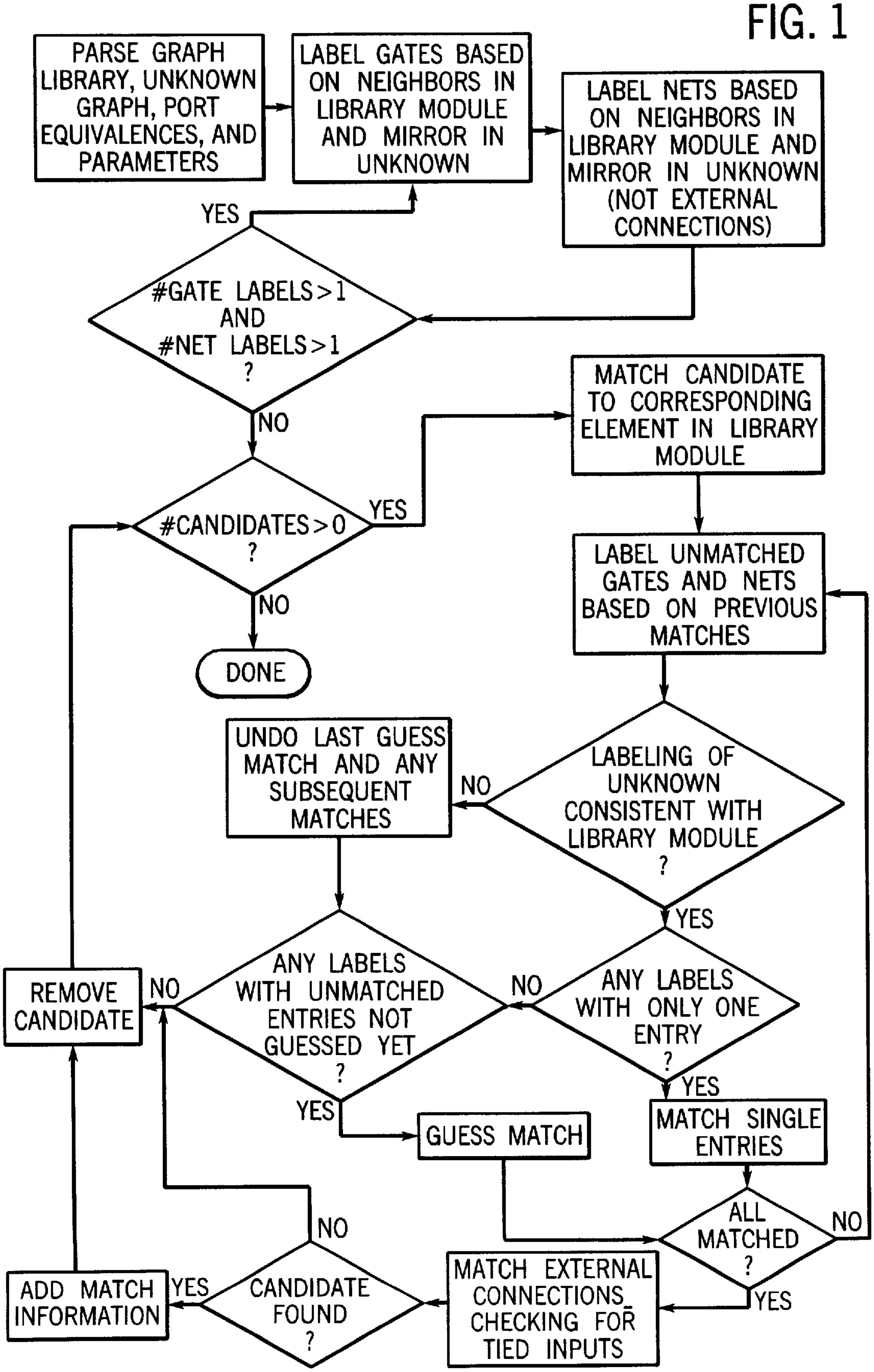
FIG. 1 is a flow diagram of the syntactic matching tool of the most preferred embodiment.
Figure 4A:
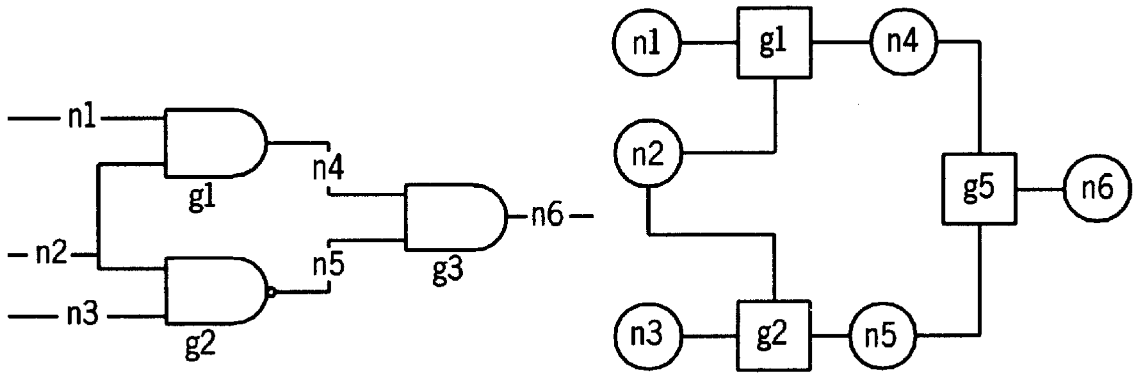
FIG. 4*a* is a gate level circuit diagram with three inputs and one output.
Figure 4B:
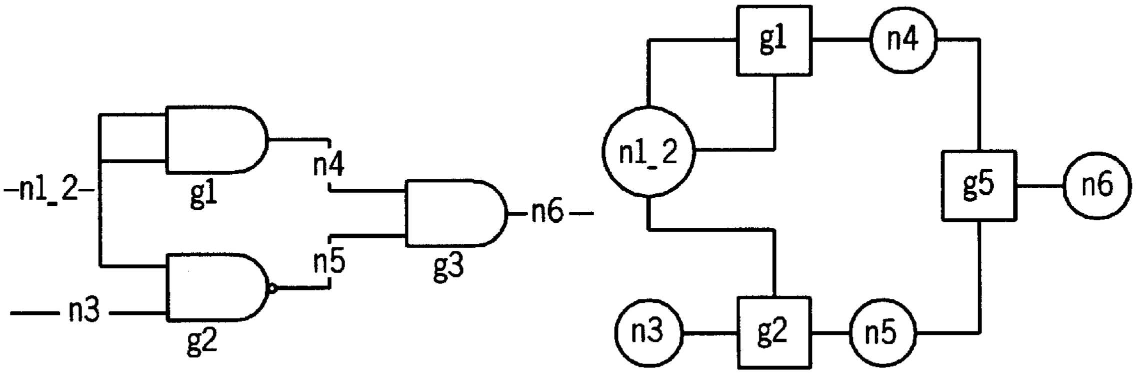
FIG. 4*b* is a gate level circuit diagram with three inputs (two of which are tied) and one output.

Substantial automation of Reverse Engineering of ICs can be accomplished with the cooperative scheme implemented by the present invention. When one applies computational methodologies to tasks for which they are suited, one achieves results that can not be achieved through conventional Reverse Engineering analysis. Syntactic and semantic matching are well suited for certain types of tasks, but each is limited in unique ways. Other methodologies are also useful not for direct matching, but rather for support of these matching methodologies through the reduction of the amount of computation necessary for successful matching.

There are several approaches that can be used to reduce the computational requirements for both semantic and syntactic matching. These approaches involve the identification and partitioning of suspected subcircuits through the identification of structural elements of the circuit that are likely to form functionally independent subdomains. Thus a practical solution to the problems of modern IC Reverse Engineering would involve the harmonious cooperation of the syntactic matching approach, the semantic matching approach, and graph analysis and partitioning approaches. The analyst continues to play a role in such a cooperative scheme, directing processes to parts of the problem for which they are best suited.

One most preferred embodiment of the present invention, called the Reverse Engineering Assistant II (REA II), is a computer system including software composed of four pieces: 1) a graphical user interface (GUI); 2) a syntactic matching tool (synTOOL); 3) a semantic matching tool (semTOOL) and 4) A partitioning tool (graphTOOL). These tools are described in detail in the following subsections.

I. User Interface. The particular form of the user interface is not critical, and there are many possibilities which will be well known to those of skill in the art. The user interface can simply be, for example, a command line shell on a UNIX platform, or it can be a fully integrated graphical user interface. The user interface need only allow the analyst access to the computational tools of the invention, in such a way that the analyst can direct each process to work on parts of a problem for which that process is well suited.

In the most most preferred embodiment a commercial product can be used called "Composer" available from Cadence Design Systems, Inc. of San Jose, Calif. (www.cadence.com). Available modules support the creation, importation and extraction of circuit diagrams. The Cadence product has its own scripting language, allowing simple integration of the invention's computational tools into a graphical user interface familiar to most computer users.

The user interface should provide basic I/O functionality, allow for common file/data structures for good workflow, and also allow the user to apply different tools at important junctures within the Reverse Engineering process.

II. Syntactic Matching Tool. The most most preferred embodiment incorporates a syntactic matching tool (synTOOL) based on Ohrlich et. al.'s SubGemini work (1985) Syntactic matching is the process of literally matching subcircuits to a library of known components. The first step in syntactic matching is to locate subcircuits that are already understood. This step uses a priori knowledge of the circuit being analyzed. If the analyst's motivation is verification, this knowledge is the design documentation. If the analyst's motivation is intellectual property analysis, he or she will know the circuit's overall function, as well as the functions of the core. This knowledge can be exploited by constructing the module library.

After the acquisition of a module library, synTOOL follows a two-phase conceptual methodology, as shown in FIG. 1. First, candidate subcircuits are generated by a labeling process. Second, the candidates are passed to a matching phase. Because the labeling process is less computationally intensive than the matching phase, the candidates are narrowed down to the maximum extent possible in phase one.

Candidate identification involves two graphs—a subject netlist and a library module. The methodology, shown in FIG. 2, eliminates border elements until no matches are found, or until a centralized and highly descriptive node from the library module is found from the library module and in one or more places in the subject netlist. A descriptive key node will have characteristics that make it less likely to be found in another module. Thus, the key nodes and candidate matches are likely targets for the second, syntactic matching phase.

In the matching phase, a syntactic matcher tests each candidate node identified in the partitioning phase as a possible match to the key node. The methodology performs an implicit breadth-first search using labels, as shown in FIG. 3.

Semantic Matching Tool

While syntactic matching is an important part of the reverse engineer's toolkit, the analyst will also need the more general, semantic technique to handle circuits for which syntactic matching fails. Logic functions can be realized in hardware in numerous ways. Circuits can include unusual or intentionally obfuscated implementations. The potential diversity of implementations limits the applicability of purely syntactic techniques because a module library cannot include all possibilities.

The most preferred embodiment contains an approach to semantic matching entitled semTOOL. A semantic matching tool works to match an abstract (e.g. canonical) form of circuit structure against a library of abstract forms, or a library from which abstract forms can be derived. The semTOOL approach begins by putting circuits into canonical form before comparing them. A canonical form is one to which all other semantically equivalent forms can be transformed via a well-defined methodology, reducing any two instances of a given function to the same formula. That is, the transformation methodology maps semantically identical circuits to a single set of logical formulas, one formula for each circuit output. A canonical form makes semantic matching a simple procedure: 1) Convert the circuits (subnet and module) to a canonical form, and 2) test the resulting formulas for identity.

More precisely, given a subject netlist S and a library module M with m inputs and n outputs, semantic matching is defined as follows: Find a subcircuit C of S having n outputs whose values are logically equivalent to the n outputs of M under some substitution of M's input names for C's input names.

Figure 6:
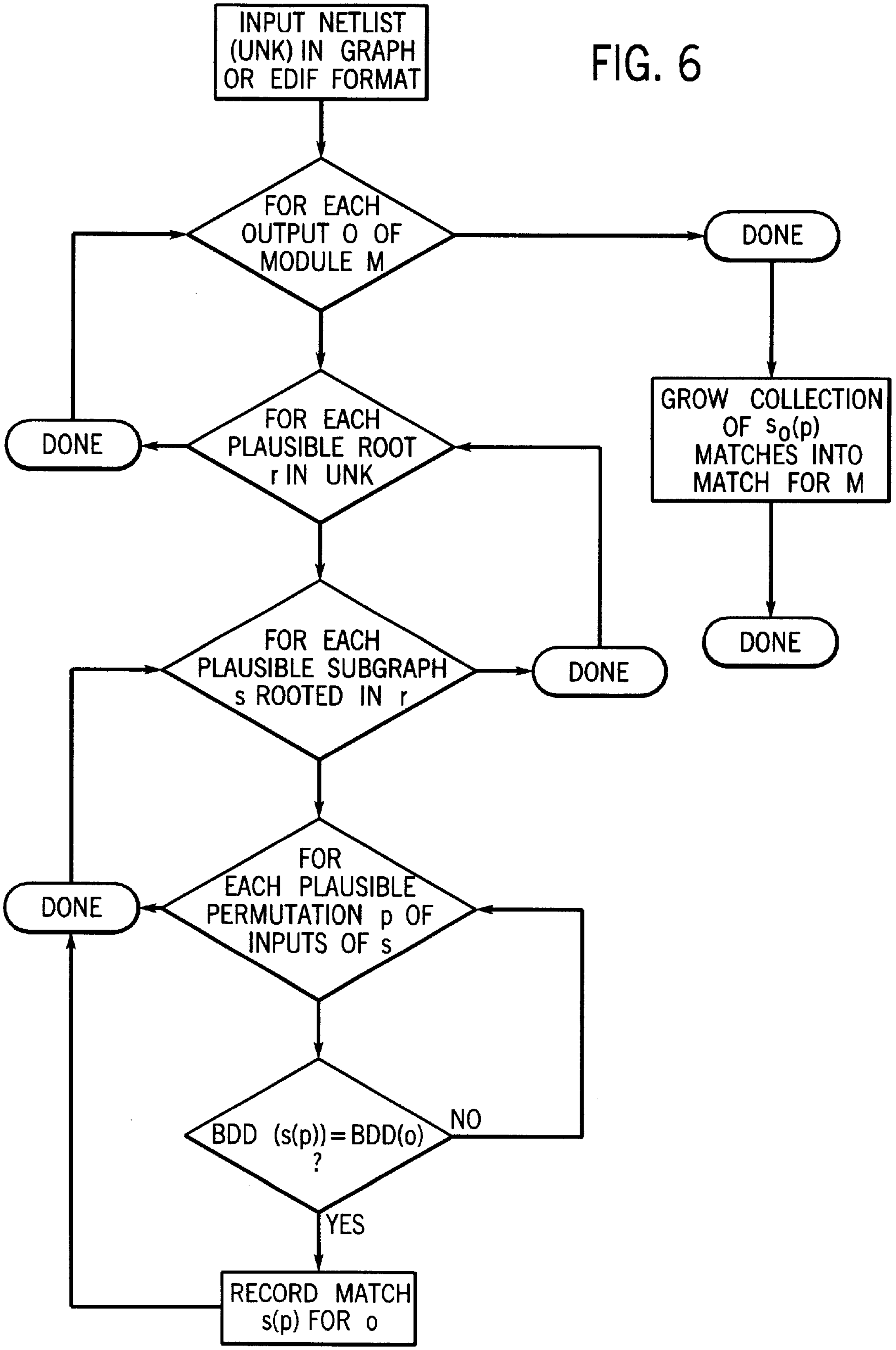
FIG. 6 is a flowchart of the semantic matching methodology of the most preferred embodiment.

FIG. 6 shows a high-level methodology for solving the semantic matching problem. The methodology has two loops, and a comparison in the inner loop. Testing equivalence is straightforward with any canonical representation; the most preferred embodiment semTOOL uses binary decision diagram (BDDs) for efficiency. Identifying input name substitution requires trying all permutations of M's inputs.

Before semTOOL can test C for equivalence to M, semTOOL must extract C from containing netlist S. The first problem is deciding which subcircuits to extract for testing. In general, the only way to determine whether two circuits are semantically identical is to compare them functionally; thus, one must extract all subcircuits to ensure complete test coverage. In other words, there are no known methods that allow the semantic matching tool to rule out some subcircuits with out actually extracting and testing them.

The requirement of exhaustive enumeration of candidate subcircuits to ensure complete search coverage raises the question: How many subcircuits are there to enumerate? The answer depends on the circuits' size and connectivity (that is, on its structure), so a general answer is impossible. However, one can gain some insight by looking at very simple structures. For example, consider a full binary tree height h. One can express the number of subtrees of this tree that contain the root (including the empty tree as a special case) with the following recurrence relation:

$$X_h+1=x^2+1, \text{ where } h\geqq 0,\ x_0=1$$

This recurrence generates the sequence: 1, 2, 5, 26, 677 458330, 210066388901, and so on. Thus, exhaustive enumeration of subcircuits quickly becomes intractable for circuits in the form of a binary tree. Generally, exhaustive searching is infeasible for all but trivially small circuits. Therefore heuristics (collections of methodologies representing different approaches) for reducing search space size are critical to a semantic matching approach's feasibility. There are two kinds of applicable heuristics that can be used with the present invention, corresponding to the two loops in the semantic matching methodology: those that reduce the number of input permutations that must be tested and those that reduce the number of candidate subnets that must be tested.

The most preferred embodiment utilizes several approaches to reducing the number of input permutations. First, signature testing can use a small set of test input vectors to quickly screen candidates that cannot possibly match because their signatures differ, and thereby reduce the number of permutations that must be tested. Second, semTOOL can search for single outputs instead of the whole module. Each output uses a subset of the gates in the whole module, and smaller circuits are generally easier to find than larger circuits when applying semantic matching. Third, through semTOOL, the analyst can place upper bounds on the number and size of tested subcircuits. Fourth, through semTOOL, the analyst can place upper bounds on the number of tested input permutations. Fifth, the analyst can specify a set of potential root gates. This set is useful if one can know or guess that a particular gate is an output gate of a subcircuit that matches a library module. The analyst might base such knowledge and/or guesses on evidence obtained from the use of either the graphTOOL or the synTOOL. The analyst can direct the semantic matching tool to test only subcircuits that contain this gate as an output gate.

The size of a circuit to be tested can also be reduced. This involves partitioning the circuit into subcircuits suspected to be functionally independent of one another. The procedures described under graph analysis are helpful toward this end.

Figure 7:
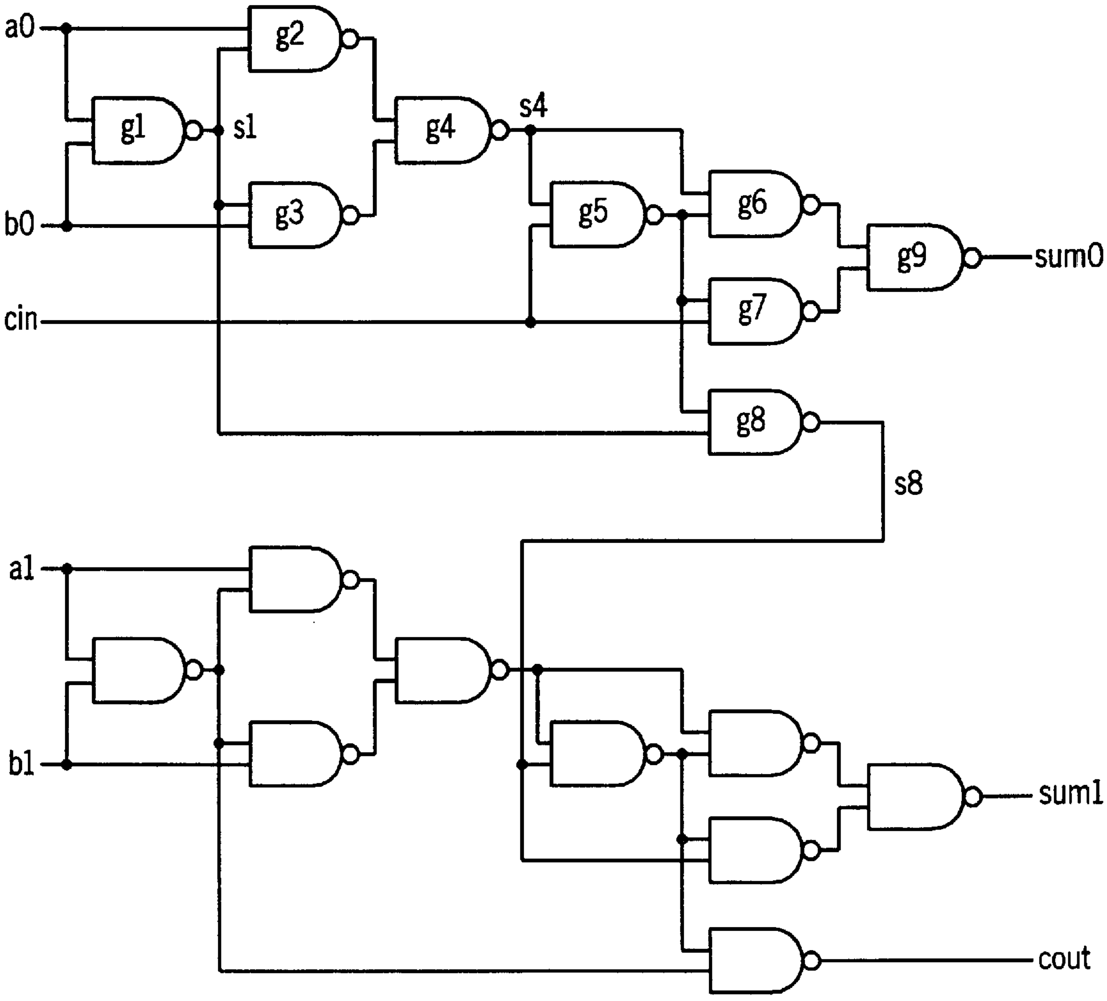
FIG. 7 is a gate-level circuit diagram of a two-bit adder.

When the search methodology has built a candidate subcircuit, the inner loop tests the subcircuit according to the methodology shown in FIG. 7. Buried in the conditional are the following steps: 1) Identify the input and output signals of C by identifying all signals that are inputs to or outputs from any gate in C and finding the two differences of those sets. The candidate inputs are signals that are gate inputs but not gate outputs, and the candidate outputs are signals that are gate outputs but not gate inputs; 2) Build canonical forms for the identified outputs. This step is conceptually trivial, given netlist connectivity and the identity of candidate inputs. A complication is that canonical forms are sensitive to the order of function inputs, so potentially all permutations of a candidate's inputs must be generated and used in the construction of candidate output canonical forms. (The most preferred embodiment semTOOL uses BDDs as the canonical form, and uses the Carnegie Mellon University BDD package to build and manipulate BDDs. Details are available from the documentation for the SIS toolkit from UC Berkeley at http://www-cad.eecs.berkeley.edu/Software/software); 3) Compare canonical forms. If for each output of a library module, there is a corresponding candidate output with a matching canonical form. SemTOOL considers the candidate an instance of the library module.

Semantic Matching Example: A simple example of semantic matching includes searching for a 1-bit full adder within a 2-bit full adder, illustrates semantic matching. The 1-bit full adder has three inputs, a, b, and $C_{in}$, and two outputs, sum and $C_{out}$. The outputs of the 1-bit full adder are defined as follows (the XOR/AND canonical form is used in the example because it is more readable than the BDD form):

$$sum = \mathrm{XOR}(c_{in}, \mathrm{XOR}(a, b))$$

$$C_{out} = \mathrm{XOR}(\mathrm{AND}(c_{in}, a), \mathrm{XOR}(\mathrm{AND}(c_{in}, a), \mathrm{XOR}(\mathrm{AND}(c_{in}, b), \mathrm{AND}(a, b)))$$

Figure 8:
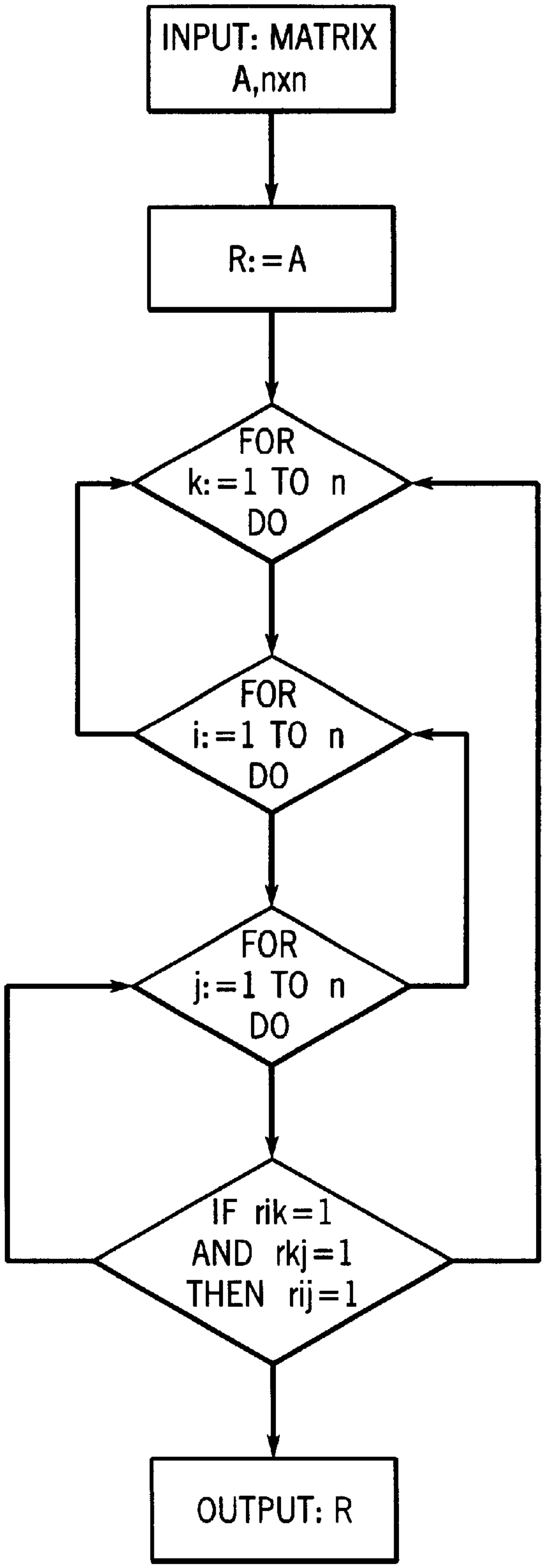
FIG. 8 is a flow diagram depicting Warshall's reachability methodology.

Looking now at FIG. 8, one can see a NAND-gate implementation of the 2-bit full adder. The problem is to find the two 1-bit adders from which the 2-bit adder is built. (The wire labeled s8 is the $C_{out}$ of bit 0 and the $C_{in}$ of bit 1.) This implementation has 54,261 subcircuits, of which 35 have the right number of inputs and outputs. Instead of analyzing each of the 35 potential matches individually, three distinct classes of subcircuits are noted.

- wrong number of inputs or outputs, so a match is impossible
- correct number of inputs and outputs; canonical forms do not match
- correct number of inputs and outputs; canonical forms match One example of each class is illustrated. First, consider the subcircuit comprising gates g5, g6, g7, and g9. It has two inputs (c and s4) and one output (sum0), so it cannot possibly be functionally equivalent to a 1-bit full adder, which has three inputs and two outputs. Therefore, the semantic matching tool can reject this subcircuit without further analysis.

Next, consider the subcircuit comprising g2, g3, g4, g5, g6, g7, g8, and g9—in other words, all labeled gates except g1. This subcircuit has three inputs (s1, $C_{in}$ and s4) and two outputs (sum0 and s8), so it cannot be immediately rejected. Instead, the tool must generate canonical forms for the two outputs and compare them to formulas 1 and 2. The canonical forms depend on how the three inputs are ordered. For the order $C_{in}$<s1<s4, the canonical forms are $$\mathrm{sum}\mathbf{0}=XOR(C_{in}, s\mathbf{4}) \quad (3)$$

$$s\mathbf{8}=XOR(s\mathbf{1}, XOR(\mathbf{1}, \mathrm{AND}(C_{in}, \mathrm{AND}(s\mathbf{1}, s\mathbf{4})))) \quad (4)$$

Obviously, no substitution of variable names will make formula 1 the same as formula 3, since 1 has two XOR operators but 3 has only one. Similarly, formulas 4 and 2 cannot match. If the input variables are reordered as s4<s1<$C_{in}$, the canonical forms are $$\mathrm{sum}\mathbf{0}=XOR(s\mathbf{4}, C_{in}) \quad (5)$$

$$s\mathbf{8}=XOR(s\mathbf{1}, XOR(\mathbf{1}, \mathrm{AND}(s\mathbf{4}, \mathrm{AND}(s\mathbf{1}, C_{in})))) \quad (6)$$

Canonical forms 5 and 6 are structurally identical to 3 and 4, respectively, so again they cannot match the library module's canonical forms. It turns out that for this simple example, all canonical forms for sumo are structurally identical, as they are for s8. Therefore, the subcircuit cannot be an instance of the 1-bit adder library module.

Finally, consider the subcircuit comprising all the label gates. It has three inputs (a0, b0, and $C_{in}$) and two outputs (sum and s8). Since it has the right number of inputs and outputs, the functional matching tool must generate canonical forms for the two outputs and compare them to formulas 1 and 2. Again the canonical forms depend on how the three inputs are ordered. For the order $a_0$<$b_0$<$C_{in}$, the canonical forms are $$sum0 = \mathrm{XOR}(a_0, \mathrm{XOR}(b_0, c_{in})) \quad (7)$$

$$s8 = \mathrm{XOR}(\mathrm{AND}(a_0, b_0), \mathrm{XOR}(\mathrm{AND}(a_0, c_{in}), \mathrm{AND}(b_0, c_{in},))) \quad (8)$$

Now, the substitution ($C_{in}$ for $a_0$, a for $b_0$, b for $C_{in}$) applied to formula 7 yields formula 1, and similarly 8 yields 2, so there are matching canonical forms. Thus, the subcircuit is an instance of the 1-bit adder library module.

Partitioning Tools

III. Partitioning tool. In order to limit the possible computational domain and make possible the use of matching methodologies on complex circuits, it can, on occasion, be necessary to identify characteristics of a circuit that allow it to be subdivided. A circuit of one million elements can be analyzed with much less difficulty if it can be divided into ten thousand subcircuits, each of discrete functionality.

Partitioning tools can be used for this purpose. A partitioning tool is essentially an methodology, operating on a description of a circuit and using known or suspected properties of circuits, that can be used to divide a circuit into smaller units suspected to be functionally independent. The subunits are more analytically tractable. The REA-II has incorporated a number of partitioning methodologies into two software sections, one called graphTOOL, and the other the already described semTOOL.

In graphTOOL the IC is represented as a directed graph. REA-II graphTOOL uses a custom graph language (see specification below), but any number of descriptive approaches could suffice. The graph language must describe the logical position and connection of circuit components, and can include additional information to be used with certain methodologies. In the REA-II graphTOOL approach, vertices represent logic gates, and edges represent connections from an output port of one gate to an input port of another gate. In addition, one can annotate vertices and edges with semantic information about a circuit for use by some of our partitioning methodologies and heuristics. In particular, each vertex can be labeled with its gate type (e.g., OR2), and each edge can be labeled with port information (e.g., the edge goes from port type Q to port type D).

The most preferred embodiment REA-II graphTOOL is a C++ program designed to help the analyst identify the functional components of a circuit. The program provides the user a number of operations that can be used to search and manipulate the graph representation of a circuit of interest. Some of the operations are based on well-known methodologies for general graphs, while others are heuristics (collections of methodologies representing a general approach) designed specifically for the circuit partitioning problem. The most preferred embodiment contains both high and low level methodologies to allow the analyst considerable flexibility.

The REA-II graphTOOL supports the following functions for basic I/O, graph partitioning and graph manipulation: help (help screen), bye (exit program), debug (set debug level), getgraph (get new graph from file), savegraph (save current graph to file), vertices (print vertex list), edges (print adjacency list), printsummary (print summary graph info), printsizes (print summary graph size info), printvisited (list vertices marked visited), printmatrix (print adjacency matrix),), clearvisited (unmark all vertices), savevisited (save visited subgraph), saveunvisited (save unvisited subgraph), DFSforward (forward search from one vertex), DFSbackward (backward search from one vertex), DFSundirected (undirected search from one vertex), allpaths (forward search for paths from one vertex), components (connected components (undirected)), articulation (articulation points), visitcomponent (mark specified component), printcomponent (print specified component (with or without border)), savecomponent (save specified component to file (w/wout border)), evalcomponent (list component vertices (with aliases)), dropcomponent (drop specified component), choosecomponent (drop all but specified component), growcomponent (grow component (dropped boundary)),), undropall (undrop all dropped vertices), undropone (undrop specified vertex), dropvisited (drop vertices marked visited), dropunvisited (drop vertices not marked visited), dropone (drop specified vertex), dropio (drop all input/output vertices), dropallio (drop all input/output vertices (recursively)), droptype (drop all vertices of specified type), dropallartic (drop all current articulation points), chooseport (specify Flip-Flop in port to keep), merge (merge two vertices), mergelines (merge back vertices with in/out degree 1), merge2cycles (collapse cycles of degree 2), warshall (path matrix (Warshall)), floyd (shortest path matrix (Floyd)), dijkstra (shortest paths (dijkstra)), cycles (find shortest cycles).

GraphTOOL is thus composed of a number of methodologies and heuristics that can be used to help identify the functional components of a circuit. In general, methodologies and heuristics can be divided into two categories: coarse partitioning and fine partitioning. Coarse partitioning methodologies attempt to find large disjoint components in a subject netlist to allow the beginning of analysis, while fine partitioning can be used later in the Reverse Engineering process to break subject netlists into library module-sized subgraphs.

In coarse partitioning, the analyst would ideally like to find an equivalence relation over the graph vertices. In particular, the analyst would like to find a relation C(x,y) such that C(x,y) is TRUE if and only if gate x and gate y belong in the same functional component. As an equivalence relation, C(x,y) effectively partitions the circuit into its functional components. The problem, of course, is that the analyst does not know how to determine relation C exactly. This is for a number of reasons, including a lack of information about the functionality of the circuit or its subcircuits, ill-definition of target subcircuits (e.g. should the analyst look for a 2-bit adder or two 1-bit adders?), and the use of gates in multiple functional components due to manufacturing optimizations.

Often the analyst must resort, instead, to trying to approximate relation C. That is, he or she uses a variety of graph methodologies and heuristics to predict the likelihood that two vertices are or are not in the same functional component. Further, rather than trying to approximate C(x, y) directly from the entire circuit, the analyst first attempts a rough partitioning of the graph to find smaller subgraphs for which more computationally expensive analyses can be applied. For the rough partitioning, the analyst will try to find subgraphs that are likely to contain complete functional components of interest and as little else as possible.

Even though the graph is directed, some very useful information can be gained by temporarily treating the graph as being undirected (i.e., ignoring the directions of the edges). Two notable examples are finding connected components and finding articulation points. Two disjoint components of the original graph are more likely to represent different functional components. In the same spirit, an articulation point (by command "articulation" or "dropallartic") that separates a graph into two or more disjoint components appears to be strong evidence for different functional components. Continuing in this same fashion, the analyst takes the existence of disjoint components and articulation points after some transformation and simplification of a graph to be reasonably good evidence for a rough partitioning.

There are a number of transformations and simplifications that can be applied in search of components and articulation points. These include, for example, dropping vertices of a specified type (e.g., "droptype buffers") and dropping input and output vertices (i.e., vertices with in degree 0 or out degree 0 by executing "dropio" or "dropallio"). It also can be fruitful to reduce the size of a graph by collapsing (merging) vertices that are likely to have tightly coupled functionality (e.g., cycles of length 2).

Path information also can be very useful for identifying pairs of vertices that do or do not belong in the same functional component. For example, let x and y be two vertices, and consider the shortest path from x to y (assuming such a path exists). It seems reasonable that the farther apart x and y appear in this sense, the less likely that they belong in the same functional component. Several of the heuristics of the most preferred embodiment are based on this simple observation (e.g., looking for nearest common ancestors and nearest common descendents) and have been used successfully to identify small components such as registers. There are also simple and efficient methodologies for finding paths, shortest paths, connected components, articulation points, and various subgraphs defined in terms of path relationships. These methodologies and some special adaptations form the basis for much of the most preferred embodiment.

Figure 9:
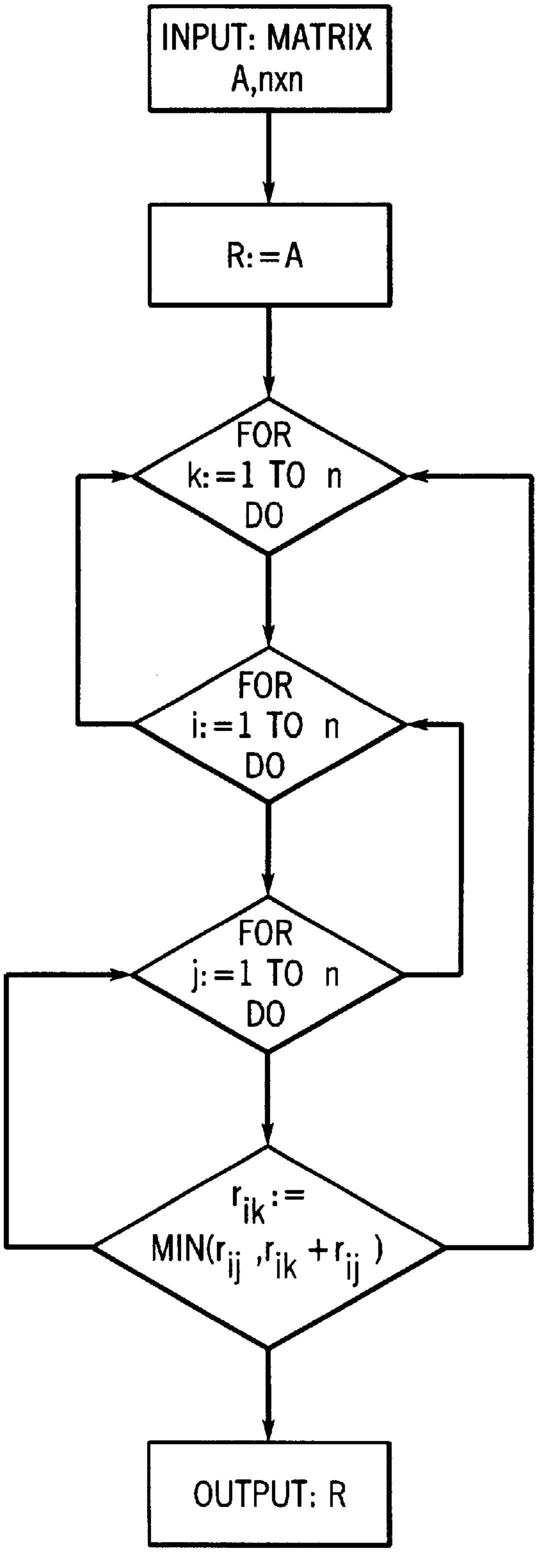
FIG. 9 is a flow diagram depicting Floyd's distance methodology.
Figure 10:
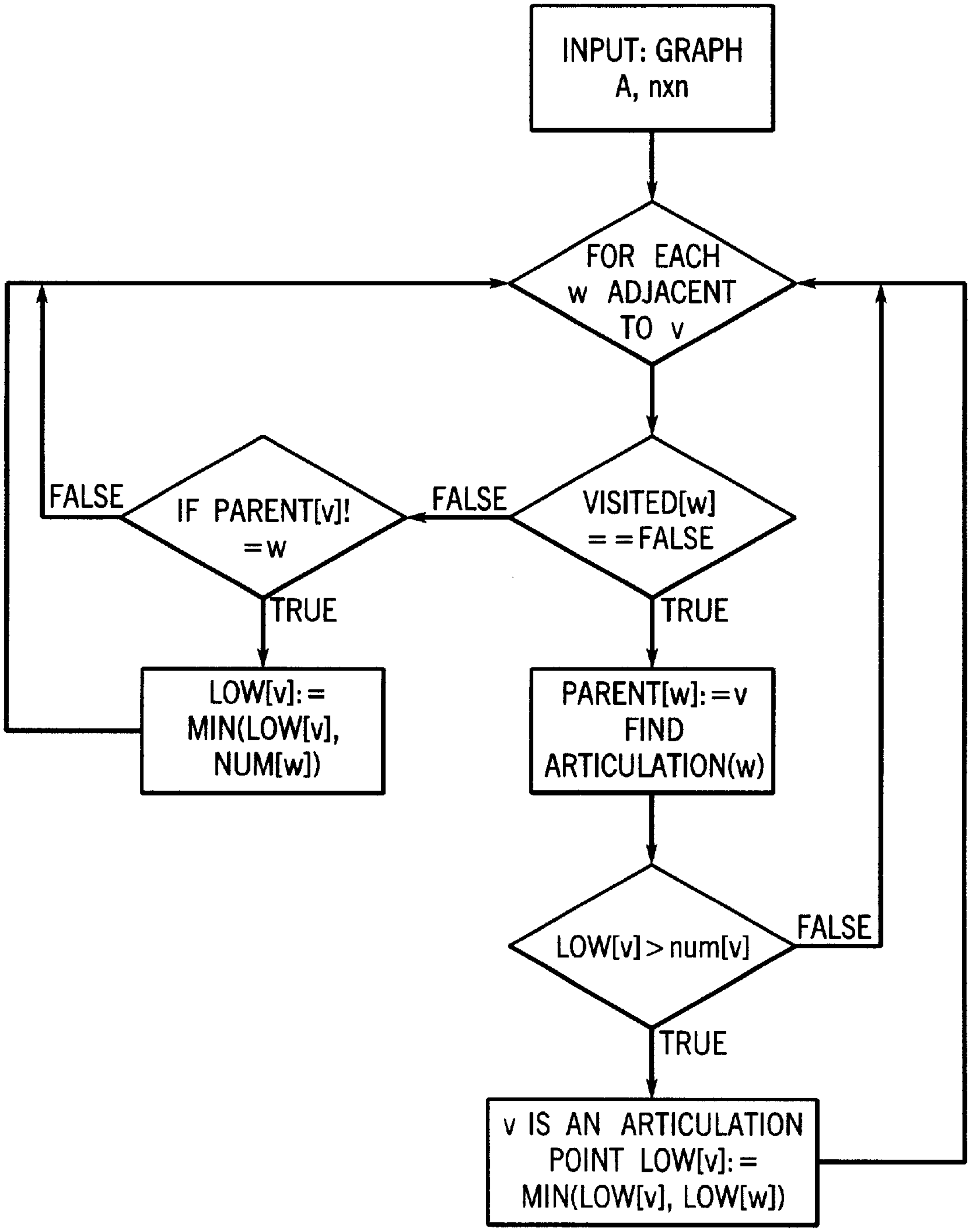
FIG. 10 is a flow diagram depicting the articulation point methodology.
Figure 11:
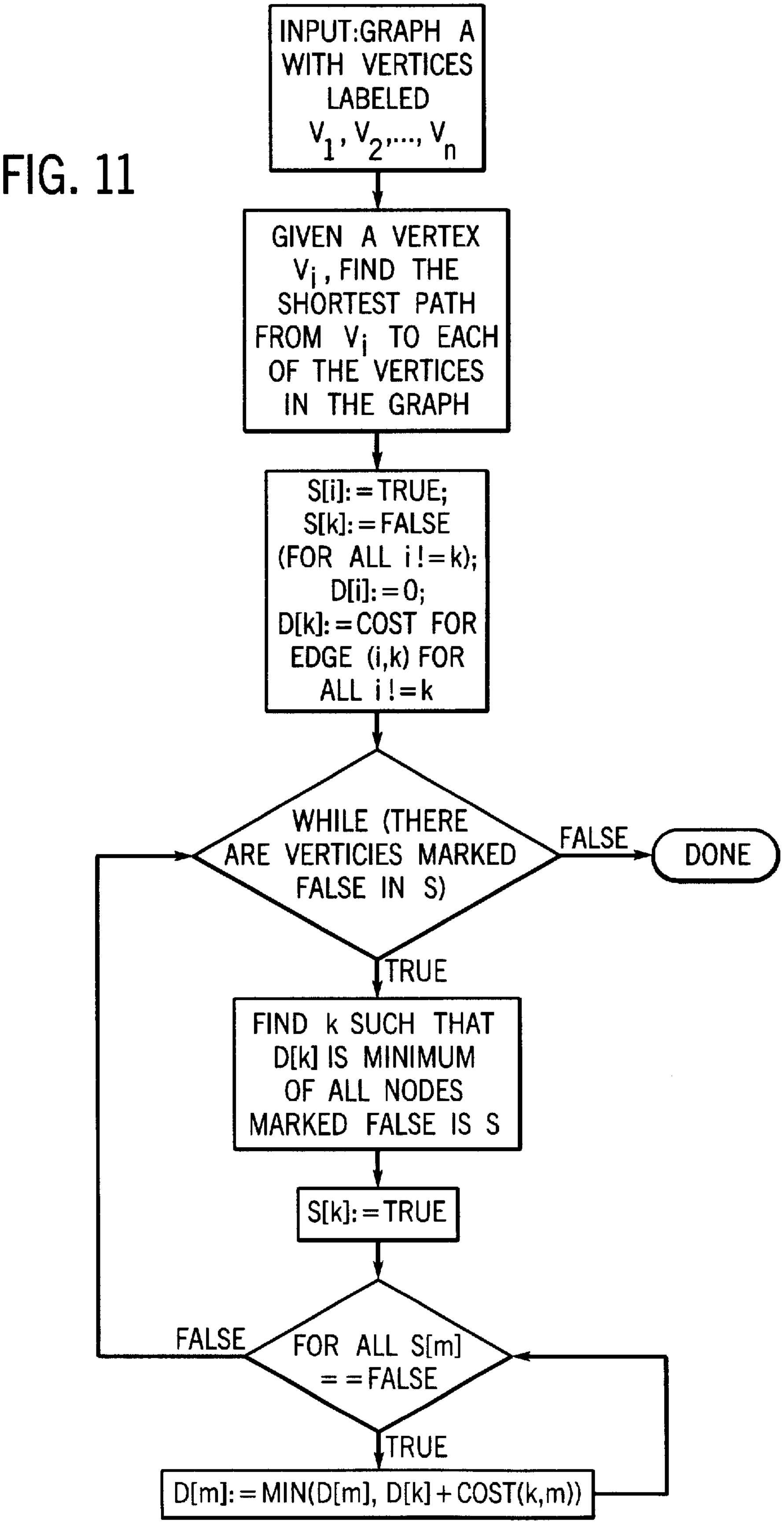
FIG. 11 is a flow diagram depicting Dijkstra's shortest distance methodology.

Several important partitioning methodologies are shown in FIGS. 9–12. The Warshall reachability methodology is exemplified in FIG. 8. An n×n adjacency matrix (n equal to the number of gates in a graph) is used as input. Any element $a_{ij}$ will equal one (1), if gate i is adjacent to gate j. The resulting output matrix R will have a global list of gate-level reachability, independent of logical distance. Gate regions that are largely independent of each other are generally less likely to be part of the same functional domain. The Floyd distance methodology is shown in FIG. 9, and Djikstra's shortest path methodology in FIG. 11. The number and distance of paths between any two gates can be expected to correlate to their likely functional interrelation. The articulation point methodology is shown in FIG. 10. The articulation point methodology identifies subcircuits connected by a single path, which are likely to be functionally independent.

Register identification can provide two benefits simultaneously. First, grouping Flip-Flops into a register is a simplification of the netlist. Second, the merging of registers and other combinational logic can describe either state machines or provide other partitioning hints. The presence of Flip-Flops in a netlist suggests that registers can exist. Determining a logical relationship between Flip-Flops, i.e., a relationship that indicates membership in a register set, is the challenge.

In the most preferred embodiemnt of the present invention, SemTOOL also contains two important coarse partitioning methods, logical signal analysis and relative position analysis. Logic signal analysis. Logic signal analysis identifies the Logical values of nets when they connect to the input of a gate. We compute the logical value present at each input port and then partition the gates into equivalence classes according to their logical values at particular ports.

Consider two flipflops A and B of a type that has a control port p. Suppose the signal at A.p is logically equivalent to the signal at B.p. This means A and B are more likely to belong to a single register, or at least to be more closely relate, than if the two signals were not logically equivalent.

The approach of the most preferred embodiment employs of flip-flops, the number of which exceeds a predetermined value. These sets of gates are correlated through a set intersection function and form the union of the sets of gates defined by these clock trees. The coarse partition's size is increased by adding gates connected to boundary nets—a process called growing.

Unfortunately, flipflops may constitute only a small portion of the gates in a netlist. Therefore, this technique serves best as an augmentation of other partitioning techniques.

Relative position analysis. From a circuit description containing positional information, the analyst can create a schematic depicting the relative position of components. This schematic, combined with the ability to select a region of interest visually, is a valuable tool for the reverse engineer in manually partitioning the circuit into candidate subcircuits.

GraphTOOL can also aid in the partitioning process by allowing the analyst to identify possible state machines. This technique of state machine identification attempts to isolate the gates forming a state machine from the rest of the subject netlist and, in the case of nested state machines, from other state machines. For the present purposes, a state machine is defined as a group of memory elements with feedback and perhaps some combinational logic. Here is a simple model for finding state machines: Start with (probable) register R. Build cyclic core C as a set of the shortest cycles containing flip-flops in R but no other flipflops.Extend cyclic core C to complete state machines:

S=transitive closure over C of $\{g_1|g_1$ outputs go to gates in S and nowhere else$\}$ $\{g_0|g_0$ inputs come from gates in S and nowhere else The most preferred embodiment also contains a number of methodologies to perform fine partitioning. Of primary significance is the cycles methodology. From a circuit perspective, a cycle indicates feedback, so an methodology to find cycles is useful. Extracting cycles from the graph and associating them with common signals (using the logical signal analysis described earlier) can help the analyst delineate functionally independent subdomains.

In addition to cycles, embodiments of the present invention can include several other fine-partitioning techniques to reduce the search space size. In the most preferred embodiment of the present invention, these tools have been incorporated directly into the semantic matcher, but can be grouped under partitioning tools. Multiple single-output search. Logic cones associated with single module outputs are potentially easier to find than the whole module because they contain fewer gates. Moreover, smaller circuits are generally easier to find than larger circuits in applying semantic matching. So this technique searches for cones associated with the module's single outputs and then uses the collection of matched gates as a core around which to build the whole module.

Excluding upstream/downstream neighbors after single-cone match. When a single output is matched, the cone's output gate and input gates must be an output gate and input gates of the whole module. Assuming I/O gates are not also internal gates, anything downstream from the output gate or upstream from the input gates cannot be in the module. So one can exclude all such gates in the subject netlist from attempts to grow the module around the cone.

Adding internal neighbors between single-output matches. When a single output is matched, the output gate and input gates define part of the module's boundary. All other gates in the cone must be internal to the module—that is, not directly connected to anything outside the module. Nets connected to internal gates are internal nets, and gates connected to internal nets are internal gates. So in considering multiple cones, one can find gates that are internal by these definitions but are not in any of the cones.

Additional partitioning tools will be recognized and utilizable to those of skill in the art.

Workflow of the Invention and Its Most Preferred Embodiments

Figure 12:
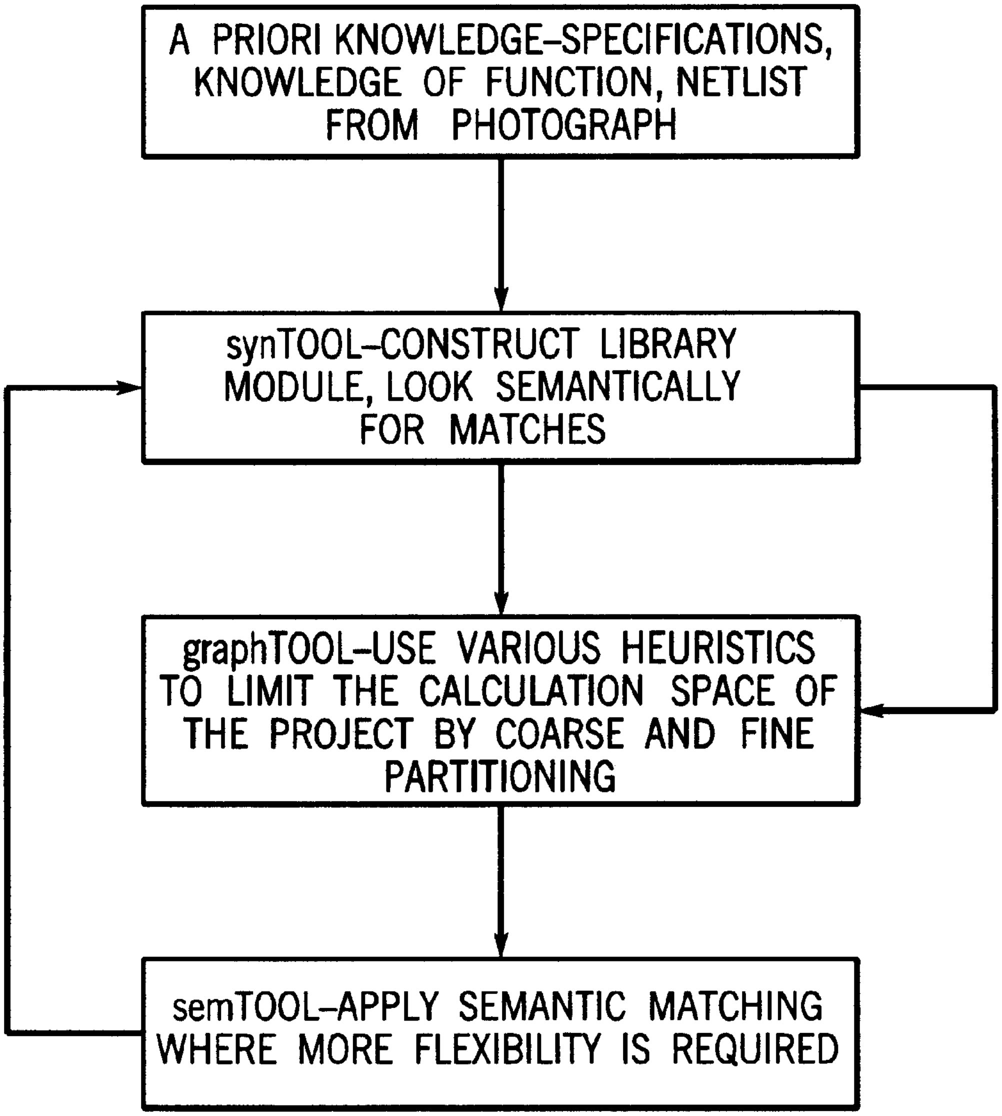
FIG. 12 is a flow diagram depicting the envisioned workflow of the invention and its most preferred embodiments.

The most preferred embodiemnt of the present invention is intended to function as a integrated whole, with each piece working cooperatively to produce a complete understanding of an IC. The following example illustrates the overall workflow process, as shown in FIG. 12.

Telephone company A buys a competitor B. In the course of evaluating competitor B's technology base, A discovers a common switching circuit that is no longer in production. The manufacturer has disappeared, and B has no specifications for the circuit, knowing only an overall function and some core functions.

The analyst begins by using the overall function and the known core function to build library modules, which, if the circuit is not too large to begin with, are then submitted to synTOOL for matching. This fails to identify matches in a reasonable period of time. The analyst uses the partition methodologies of graphTOOL, generating suspect regions of the circuit for subdivision.

A subregion is selected, and resubmitted to synTOOL. SynTOOL identifies several module matches. These matches are then used to begin semantic analysis with semTOOL, by choosing anchor gates from within various identified modules. When semTOOL fails to produce matches in a reasonable amount of time, the analyst turns to fine partitioning techniques, attempting to find subcircuits composed of no more than a few thousand gates. SemTOOL is applied once again to produce some matching components.

During this process, the analyst is updating his or her library modules with candidates from discovery. The process repeats itself, as directed by the analyst, with successive applications of synTOOL, semTOOL and graphTOOL, until enough of the circuit is identified for the purposes of Company A. This example illustrates the value of the interrelationship between the various parts of the invention and its most preferred embodiment.

Appendix: REA-II Graph Language Specification

In order to simplify the design, implementation, and maintenance of the REA-II, a common interface language has been proposed for all of the tools. This language should be more compact than EDIF yet flexible enough to contain any data which might be needed. The following specification is based upon the graph language currently used by the graph tool.

A graph, which describes a circuit, starts with the keyword__begin__and is concluded with the keyword__ end__. A graph typically contains sets of edges which represent connections between pairs of gates. The edges can be either directed as in the case of the output of a NAND gate to the input of an OR gate or undirected as in the case of two transistors being connected by their source terminals. The main differences between the common HDLs used previously (i.e. EDIF and Verilog) and the current graph language are that the HDLs support multiple netlists within a single file and the ability to define base elements which contain no implementation. Both of these features have been added to the graph language. Attribute sections have also been added which allow for data not yet specified. Many of the keyword declarations are optional in order to permit a wide variety of netlists to be imported. It is suggested that as much of the HDL data as possible be included in the graph output.

A.1 Keywords

Each keyword signals the beginning of an input mode which stays in effect until another keyword is reached. Each keyword can be thought of as heading a list of input items. Although not absolutely necessary, it is recommended that a keyword appear on a line by itself and to have each list item appear on a line by itself.

A.1.1 __begin__

This keyword denotes the beginning of a graph definition, and in conjunction with __end__, enables the passing of several graphs in a single file. Thus, the HDL style of embedding library definitions along with the subject netlist may be used. A __begin__/__end__ section can not be imbedded within another __begin__/__end__ section.

A.1.2 __commands__

This keyword is reserved for passing commands to a tool to be executed upon the accompanying graph. The format of the commands here is dependent upon the tool which receives the graph definition, but each command must be enclosed in quotes (i.e. "this is a command"). If a quote (") needs to be sent as part of the command, then an escape quote (\") can be used (i.e. "this \"should\" be quoted"). There are no restrictions on the content of messages. If this section is within a __begin__/__end__ section, then the commands are in reference to that particular graph. If the commands are outside the __begin__/__end__ section, then the commands are to be applied to all of the graphs following the __commands__ section in the file.

A.1.3 __directed__edge__

Format of entries:

[<from__vertex name>@]<port name>[<to__vertex name>@]<port name> <edge name>

This section of the graph definition lists the directed connections. The <edge name> specifies the label for the connection or its net name. The <vertex name>@ is an optional field designating to which gate instance the edge is connected and is used when the connection is not to an external port. The __directed__edge__ keyword can only be used within a __begin__/__end__ section.

A.1.4 __edge__attribute__

Format of entries:

<edge name> (<attribute name> <data> )+

The <attribute name> is the name of the edge related information given in <data> for the connection called <edge name>. Here are some possible uses:

<edge name> (__bus__<bus name> ) (__power__rail__ <rail type> )

The __edge__attribute__ keyword can only be used within a __begin__/__end__ section.

A.1.5 __end__

This keyword indicates the end of a graph definition. See section A.1.1 for more details of its use.

A.1.6 __graph__attribute__

Format of entries:

( <attribute name> <data> )+

The <attribute name> is the name of the graph related information given in <data>. Here are some possible uses:

(__library__name__ <library name> ) (__cell__name__ <cell name> )

(__view__name__ <view name> )

(__vertex__ordering__"<vertex name> <vertex name> <vertex name>")

If __graph__attribute__ is used outside a __begin__end__ section, the entries apply to all graphs which follow the declaration. If __graph__attribute__ is used within a __begin__/__end__ section, the entries apply only to the graph within that section.

A.1.7 __undirected__edge__

Format of entries:

[<vertex1 name>@]<port name> [<vertex2 name>@] <port name> <edge name>

This section of the graph definition lists the undirected connections. The <edge name> specifies a label for the connection or its net name. The <vertex name>@ is an optional field used to specify to which gate instance the edge is connected. If the optional field is not used, the port is assumed to be external. The __undirected__edge__ keyword can only be used within a __begin__/__end__ section.

A.1.8 __vertex__attribute__

Format of entries:

<vertex name> ( <attribute name> <data> )+

The <attribute name> is the name of the vertex related information given in <data> for the gate <vertex name>. Here are some possible uses:

<vertex name> (__position__ <X coord> <Y coord> ) (__gate__type__ <type name> )

<vertex name> (__port__ <direction> ) (__cluster__ <cluster name><confidence>)

The __vertex__attribute__ keyword can only be used within a __begin__/__end__ section.

A.2 Comments (//)

A comment symbol, the double forward slash (//), is in effect from the point it is encountered until the end of the line. The comment may be within any of the keyword blocks or between graph definitions. Comments are ignored by the parser.

A.3 Graph Structure

In order to decrease the time needed to parse graphs and to highlight the implicit dependencies of the keyword blocks, an ordering of the keyword blocks is enforced. The diagram below depicts the ordering and dependencies. Any graph description must follow a directed path from __begin__ to __end__.

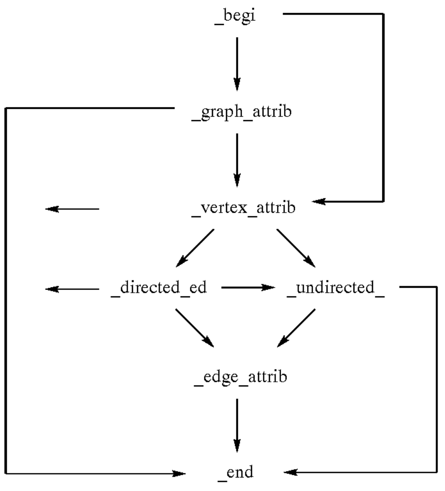

A.4 Spacing

In general, spacing is not significant for parsing the graph language, but there are two structures which require special spacing in order to allow the most versatile token naming. The first instance, the at symbol (@), indicates a port connection used by an edge and must have spaces imbedded around it so that the symbol is not interpreted as part of the gate or port label. Secondly, when parentheses are used to indicate attributes for edges, vertices, or graphs, they must have spaces around them in order to differentiate between labels and attribute grouping. The example shown later exemplifies the spacing requirements.

A.5 Example

A.5.1 Verilog

```
moldule HADD (CO, Y, A, B);
input A,B;
output Y,CO;
assign {CO,Y} = A + B);
endmodule
module FifoOut__DW01__inc__7__1 (A, SUM);
input [6:0] A;
output [6:0] SUM;
    wire carry__6, n5, n6, n7, n8, n9, n10;
    xor U4 ( SUM[4], n9, n8 );
    HADD U5 ( .CO(carry__6, .Y(SUM[5]), .A(A[5]), .B(n5) );
```

-continued

```
    xor U1__6 (SUM[6], A[6], carry__6);
    not U6 ( SUM[0], A[0]);
    nor U7 (n5, n6, n8, n7);
    xnor U8 (SUM[3], A[3], n6);
    xnor U9 (SUM[1], A[1], SUM [0]);
    or U10 ( n9, n6, n7 );
    nand U11 ( n10,A[1], A[0] );
    xnor U12 ( SUM[2], n10, A[2] );
    not U13 ( n7, A[3] );
    not U14 ( n8, A[4] );
    nand U15 ( n6, A[1], A[0], A[2] );
endmodule
```

A.5.2 Graph

```
//This is an example of the graph language specification.
//This file was done "by hand."
//Author: C. M. Lain
//Date: February 26, 1999
__commands__
"do the following command"
__begin__
__graph__attribute__
    (__cell__name__HADD) (__function__ "assign {CO,Y} =
    A + B")
__vertex__attribute__
    CO (__port__OUT)
    Y (__port__OUT)
    A (__port__IN)
    B (__port__IN)
__end__
__begin__
__graph__attribute__
    (__library__name__WD)
    (__cell__name__FifoOut__DW01__inc__7__1__)
__vertex__attribute__
    U4        (__gate__type__xor)
    U10       (__gate__type__or)
    U14       (__gate__type__not)
    U5        (__gate__type__HADD)
    U7        (__gate__type__nor)
    U1__6     (__gate__type__xor)
    U6        (__gate__type__not)
    U8        (__gate__type__xnor)
    U9        (__gate__type__xnor)
    U11       (__gate__type__nand)
    U12       (__gate__type__xnor)
    U13       (__gate__type__not)
    U15       (__gate__type__nand)
    A[0]      (__port__IN)
    A[1]      (__port__IN)
    A[2]      (__port__IN)
    A[3]      (__port__IN)
    A[4]      (__port__IN)
    A[5]      (__port__IN)
    SUM[0]    (__port__OUT)
    SUM[1]    (__port__OUT)
    SUM[2]    (__port__OUT)
    SUM[3]    (__port__OUT)
    SUM[4]    (__port__OUT)
    SUM[5]    (__port__OUT)
__directed__edge__
    U4 @ Y      SUM[4]       SUM[4]
    U10 @ Y     U4 @ A       n9
    U14 @ Y     U4 @ B n8
    U5 @ Y      SUM[5]       SUM[5]
    A[5]        U5 @ B       A[5]
    U5 @ CO     U1__6 @ B    carry__6
    U7 @ Y      U5 @ B       n5
    U1__6 @ Y   SUM[6]       SUM[6]
    A[6]        U1__6 @ A    A[6]
    U6 @ Y      SUM[0]       SUM[0]
    A[0]        U6 @ A       A[0]
    U13 @ Y     U7 @ C       n7
    U14 @ Y     U7 @ B       n8
```

-continued

```
      U15 @ Y    U7 @ A     n6
      U8 @ Y     SUM[3]     SUM[3]
      A[3]       U8 @ A     A[3]
      U15 @ Y    U8 @ B     n6
      U9 @ Y     SUM[1]     SUM[1]
      A[1]       U9 @ A     A[1]
      SUM[0]     U9 @ B     SUM[0]
      U15 @ Y    U10 @ A    n6
      U13 @ Y    U10 @ B    n7
      U11 @ Y    U12 @ A    n10
      A[1]       U11 @ A    A[1]
      A[0]       U11 @ B    A[0]
      U12 @ Y    SUM[2]     SUM[2]
      A[2]       U12 @ B    A[2]
      A[3]       U13 @ A    A[3]
      A[4]       U14 @ A    A[4]
      A[1]       U15 @ A    A[1]
      A[0]       U15 @ B    A[0]
      A[2]       U15 @ C    A[2]
__edge__attribute
      A[0]       (__bus__ A)
      A[1]       (__bus__ A)
      A[2]       (__bus__ A)
      A[3]       (__bus__ A)
      A[4]       (__bus__ A)
      A[5]       (__bus__ A)
      SUM[0]     (__bus__ SUM)
      SUM[1]     (__bus__ SUM)
      SUM[2]     (__bus__ SUM)
      SUM[3]     (__bus__ SUM)
      SUM[4]     (__bus__ SUM)
      SUM[5]     (__bus__ SUM)
__end__
```

A.6 Language Specification

In the following specification, parentheses are used for grouping. The <OPAREN> and <CPAREN> indicate when parentheses are expected by the grammar. The * indicates zero or more instances. The + indicates one or more instances, and the ? indicates either one or no (0) instances.

```
<aFile>
        := <file__segment> +
<file__segment>
        := <graph>
        | <commands>
        | <comment>
        | <graph__attribute>
        <graph>
<comment>
        := // <comment__line>
<comment__line>
        := <LINE>
<commands>
        := __commands__
        <command__line>*
<command__line>
        := <QUOTED__CHARS>
<graph>
        := __begin__
        (<graph__attribute> | <vertex__attribute>)
        __end__
<directed__edge>
        := __directed__edge__
        <edge__item>*
        (<undirected__edge> | <edge__attribute>)?
<undirected__edge>
        := __undirected__edge__
        <edge__item>*
        <edge__attribute>?
<vertex__attribute>
        := __vertex__attribute__
        <vertex__entry>*
        (<directed__edge> | >undirected__edge>)?
```

-continued

```
<vertex__entry>
        := <vertex__label> <attribute__data>*
<edge__attribute>
        := <__edge__attribute__
        <edge__entry__
<edge__entry>
        := <edge__label> <attribute__date>*
<graph__attribute>
        := __graph__attribute__
        <attribute__date>*
        <vertex__attribute> ?
<attribute__data>
        := <OPAREN> <attribute> <data> <CPAREN>
<attribute>
        := <TOKEN>
<data>
        := <TOKEN>
        | <QUOTED__CHARS>
<edge__item>
        := <vertex> <vertex> <edge__label>
<vertex>
        := <vertex__label> @ <port__name>
        | <port__name>
<edge__label>
        := <TOKEN>
<port__name>
        := <TOKEN>
<vertex__label>
        := <TOKEN>
<LINE>
```

A line is any sequence of characters terminated by an end-of-line or end-of-file.

```
<QUOTED__CHARS>
   A quoted__chars is a sequence of characters beginning with a quote
   (") and terminated by quote ("). If a quote needs to be part of the
   quoted__chars, then an escaped quote (\") should be used.
<TOKEN>
```

A token can consist of any sequence of characters except for "//" which indicates a comment and quotes (") which are reserved for quoted__chars. Also, the "@" can be part of a token but can not be a token by itself.

```
      <CPAREN>
            A cparen is the close parenthesis (")").
      <OPAREN>
            A oparen is the open parenthesis ("(").
```

What is claimed is:

1. A method for analyzing a circuit, comprising the steps of:

acquiring a netlist;

analyzing said netlist with at least two of the set of a syntactic matching tool, a semantic matching tool, or a partitioning tool, thereby enabling said analyzing and performing a Reverse Engineering of said circuit.

2. The method of claim 1, wherein said syntactic matching tool, said semantic matching tool and said partitioning tool are used in the analysis of the same circuit.

3. The method of claim 2, wherein said netlist comprises a data structure that can be used with said syntactic matching tool, said semantic matching tool, and said partitioning tool.

4. The method of claim 2, wherein said tools are used iteratively.

5. The method of claim 1, wherein said semantic matching tool comprises a methodology to reduce at least subparts of said netlist to one or more canonical forms, and then to match said canonical forms against a library.

6. The method of claim 2, wherein the method is executed by a computer system comprising a processor and memory.

7. The method of claim 1, further comprising the steps of a) acquiring an output from the at least two tools; and b) passing said output to the input of another tool.

8. The method of claim 1, further comprising the steps of a) further analyzing said netlist using said partitioning tool to find a discrete subpart of said netlist;

b) analyzing the discrete subpart with at least one of the set of a syntactic matching tool or semantic matching tool;

c) repeating steps a and b until a discrete subpart is identified.

9. The method of claim 8, further comprising a) repeating steps a through c of claim 8 until the majority of the circuit is identified.

10. Computer software to aide the Reverse Engineering of a circuit, comprising a user interface;

a syntactic matching tool;

a semantic matching tool; and a graph analysis tool allowing a netlist to be analyzed during performing of said Reverse Engineering of said circuit.

11. The software of claim 10, wherein the user interface comprises a graphical user interface and wherein each tool can be launched from within the graphical user interface.

12. The software of claim 10, further comprising a netlist data structure usable by each tool.

13. The software of claim 11, further comprising a netlist data structure usable by each tool.

14. The software of claim 10, wherein the semantic matching tool contains a methodology to reduce subparts of the netlist to at least one canonical form, and to compare said canonical forms to a library of known canonical forms.

15. The software of claim 11, wherein the wherein the semantic matching tool contains a methodology to reduce subparts of the netlist to at least one canonical form, and to compare said canonical forms to a library of known canonical forms.

16. The software of claim 10, wherein the syntactic matching tool substantially comprises synTOOL.

17. The software of claim 11, wherein the semantic matching tool substantially comprises semTOOL.

18. The software of claim 10, wherein the partitoning tool substantially comprises graphTOOL.

* * * * *